United States Patent
Laackmann et al.

(10) Patent No.: US 6,798,234 B2
(45) Date of Patent: Sep. 28, 2004

(54) APPARATUS FOR PROTECTING AN INTEGRATED CIRCUIT FORMED IN A SUBSTRATE AND METHOD FOR PROTECTING THE CIRCUIT AGAINST REVERSE ENGINEERING

(75) Inventors: Peter Laackmann, München (DE); Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 10/368,787

(22) Filed: Feb. 19, 2003

(65) Prior Publication Data

US 2003/0132777 A1 Jul. 17, 2003

Related U.S. Application Data

(63) Continuation of application No. PCT/EP01/08370, filed on Jul. 19, 2001.

(30) Foreign Application Priority Data

Aug. 21, 2000 (EP) .............................................. 00117931

(51) Int. Cl.[7] .............................................. H03K 17/16
(52) U.S. Cl. ......................................... 326/21; 326/82
(58) Field of Search .............................. 326/14, 16, 21, 326/82, 83

(56) References Cited

U.S. PATENT DOCUMENTS

| | | | |
|---|---|---|---|
| 4,293,778 A | 10/1981 | Williams | |
| 4,868,489 A | 9/1989 | Kowalski | |
| 5,406,630 A | 4/1995 | Piosenka et al. | |
| 5,861,652 A | 1/1999 | Cole et al. | |
| 5,892,369 A | 4/1999 | Sourgen et al. | |
| 6,078,537 A | 6/2000 | Zellner et al. | |
| 6,630,830 B2 * | 10/2003 | Omeragic et al. | 324/338 |
| 6,651,488 B2 * | 11/2003 | Larson et al. | 73/61.62 |

FOREIGN PATENT DOCUMENTS

| | | |
|---|---|---|
| DE | 40 18 688 A1 | 1/1991 |
| EP | 0 300 864 B1 | 1/1989 |
| WO | WO 97/36326 | 10/1997 |
| WO | WO 00/28399 | 5/2000 |

* cited by examiner

Primary Examiner—Don Le
(74) Attorney, Agent, or Firm—Laurence A. Greenberg; Werner H. Stemer; Ralph E. Locher

(57) ABSTRACT

An apparatus for protecting an integrated circuit formed in a substrate and a method for protecting the integrated circuit against reverse engineering includes an active shield having a signal transmitter, a signal receiver, at least two conductor tracks running between the signal transmitter and the signal receiver, and a drive and evaluation device connected to the signal transmitter and to the signal receiver. The shield at least partially covers the integrated circuit. A covering composition applied on the substrate forms a mechanical protection of the integrated circuit. The shield has a switching apparatus. As a result, a capacitive measurement method can be carried out in a first switching state and damage to the shield can be detected in a second switching state.

32 Claims, 2 Drawing Sheets

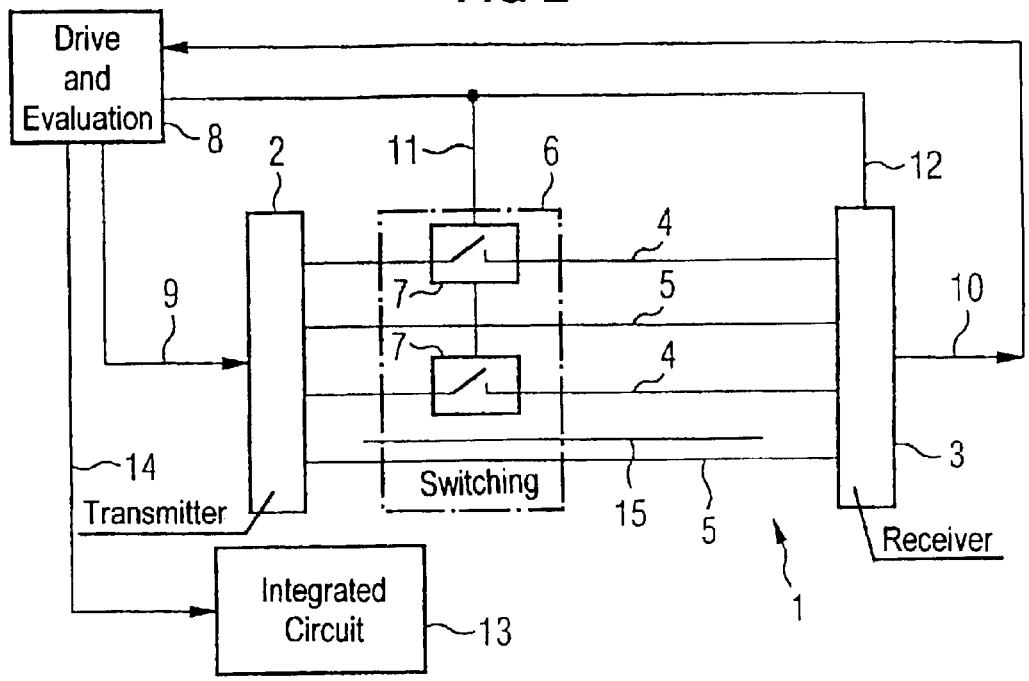
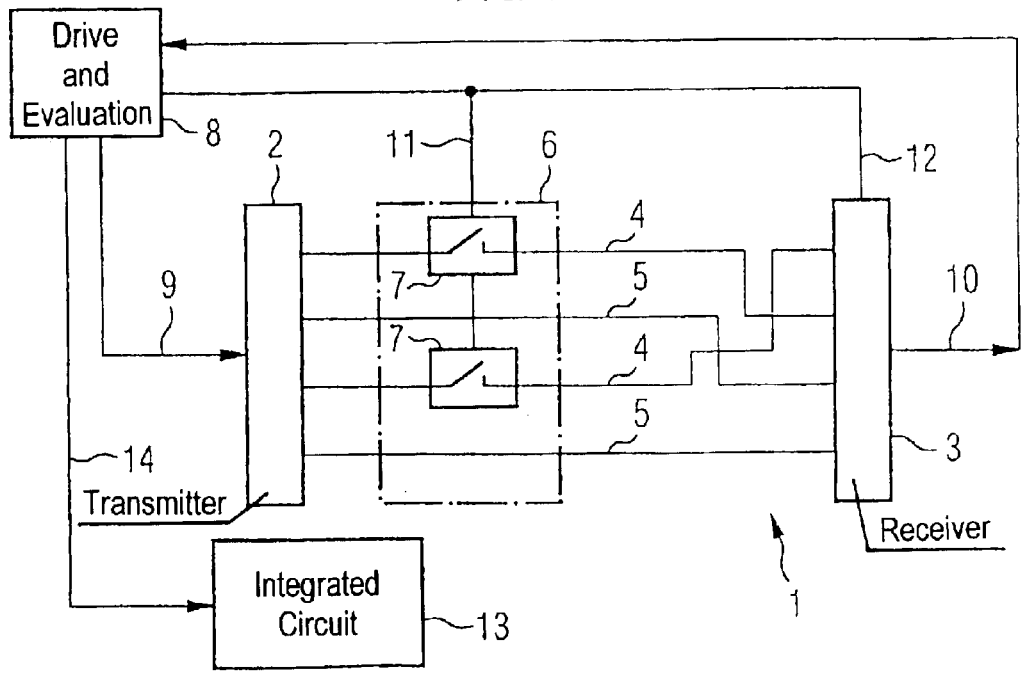

APPARATUS FOR PROTECTING AN INTEGRATED CIRCUIT FORMED IN A SUBSTRATE AND METHOD FOR PROTECTING THE CIRCUIT AGAINST REVERSE ENGINEERING

CROSS-REFERENCE TO RELATED APPLICATION

This application is a continuation of copending International Application No. PCT/EP01/08370, filed Jul. 19, 2001, which designated the United States and was not published in English.

BACKGROUND OF THE INVENTION

Field of the Invention

The present invention relates to an apparatus for protecting an integrated circuit formed in a substrate and a method for protecting the integrated circuit against reverse engineering having a shield, which at least partially covers the integrated circuit and which includes a signal transmitter, a signal receiver, at least two conductor tracks running between the signal transmitter and the signal receiver, and a drive and evaluation device connected to the signal transmitter and the signal receiver and also having a covering applied on the substrate.

It is possible to subject an integrated circuit to an analysis, so-called "reverse engineering." This analysis may serve merely to analyze the method of operation or else to influence the method of operation for the purpose of manipulating a data content or the functional sequence. For the purpose of analysis, in a first step, the material that covers the surface of the chip is resolved. This material may be either a plastic molding composition that forms the housing of the semiconductor component, or a so-called "globe top," which merely serves to protect the chip surface and the electrical connections against mechanical damage. Such a "globe top" is used in smart card modules, for example. Moreover, a thin plastic layer ("imide", "photoimide") is usually applied on the passivation layer of the chip. The plastic layer is also removed during a reverse engineering method. After the removal of the material that surrounds or covers the semiconductor chip, the passivation layer of the semiconductor chip is, generally, accessible. The passivation layer can be selectively removed by etching methods, laser, or Focused Ion Beam (FIB) methods. Access to the signal lines is obtained as a result of this.

An analysis of the integrated circuit is undesirable, in principle. Particularly in the case of security-relevant circuits, for example, a microcontroller on a smart card that includes the function of an electrical purse or the like, reverse engineering should be prevented if possible. In practice, various methods already exist by which such an analysis can at least be made more difficult. To protect an integrated circuit, it is known to cover it with a so-called shield. In such a case, a shield includes at least two conductor tracks running above the integrated circuit. In the case of the passive shields, the supply potential of the semiconductor chip is present on at least one of the conductor tracks, and the ground potential is present on the other conductor track. An interruption or a short circuit of these conductor tracks is detected by an evaluation circuit that, then, cuts the integrated circuit into a secure state. This may be, by way of example, the triggering of a reset or the erasure of the memory contents. In the case of the so-called active shields, the signal present on the respective conductor tracks can be varied by a drive and evaluation apparatus. This increases the security against an analysis with respect to a passive shield because the shield cannot be rendered nonfunctional by a bypass or a rewiring. In such a case, the course of the conductor tracks can be realized in meandering form or in grid form in a plurality of planes.

International Application WO 97/36326, corresponding to U.S. Pat. No. 5,861,652 to Cole et al., discloses a method and an apparatus by which it is possible to detect the removal of a plastic housing including molding composition. In such a case, the changing capacitance between two conductor tracks upon the removal of the plastic molding composition is detected. For such a purpose, a plurality of sensors is provided in the plastic molding composition housing. However, the sensors can easily be ascertained before the plastic molding composition is actually removed, and can, therefore, be selectively omitted during the removal of the housing so that a change in the capacitance cannot be detected.

Furthermore, U.S. Pat. No. 4,868,489 to Kowalski discloses a method that detects the removal of the passivation layer over the chip surface. A plurality of detectors that are made comparatively large is provided for such a purpose. The size of the detectors means that they can easily be discerned and, thus, circumvented. Moreover, the configuration illustrated in Kowalski has the disadvantage that a shield that covers the integrated circuit has to have a cutout in each case at the locations at which the detectors are situated. This results in weak points at which an analysis is made possible.

SUMMARY OF THE INVENTION

It is accordingly an object of the invention to provide an apparatus for protecting an integrated circuit formed in a substrate and a method for protecting the integrated circuit against reverse engineering that overcome the hereinafore-mentioned disadvantages of the heretofore-known devices and methods of this general type and that enable an improved protection against an analysis.

With the foregoing and other objects in view, there is provided, in accordance with the invention, an apparatus for protecting an integrated circuit formed in a substrate, including a shield at least partially covering the integrated circuit, the shield having a signal transmitter, a signal receiver, at least two conductor tracks running between the signal transmitter and the signal receiver, a drive and evaluation device connected to the signal transmitter and to the signal receiver, a covering applied on the substrate, and a switching apparatus having a first switching state enabling a capacitive measurement and a second switching state enabling detection of damage to the shield.

The invention proposes an apparatus for protecting an integrated circuit formed in a substrate, having an active shield, in the case of which the shield has a switching apparatus. As a result, a capacitive measurement method can be carried out in a first switching state and damage to the shield can be detected in a second switching state.

Thus, according to the invention, the active shield can be changed over between two functions. If the switching apparatus is in the second switching state, then it is possible to identify short circuits between conductor tracks or interrupted conductor tracks. It is, thus, possible to identify a manipulation at the active shield, this functionality corresponding to the customary method of operation of an active shield.

If the switching apparatus is in the first switching state, then a capacitive test method is carried out between two signal lines. By way of example, one of the lines has applied to it a signal that can be detected on the second line by an evaluation circuit given a correspondingly high capacitance between the two lines. In such a case, the signal fed into the one conductor track may be constant or have a periodic or a random character.

The apparatus according to the invention has the particular advantage that the two measurement methods described above reciprocally protect one another. A capacitive measurement method can be circumvented, for example, by applying short-circuit links between two conductor tracks by FIB methods. However, such an attack would be detected by the "normal" operating mode if the switching apparatus is in the second switching state. On the other hand, the capacitive measurement method protects the conventional active shield method because an attack would necessitate a removal of the covering composition, which is detected by the capacitive measurement method.

The combination of two detection methods, which merely dictates the provision of a switching apparatus in an active shield, makes it possible to significantly increase the protection against an analysis of an integrated circuit. Because, in contrast to the prior art, the two measurement methods are not spatially separate, even locally limited attacks no longer achieve their aim.

In accordance with another feature of the invention, the switching apparatus is only provided in a portion of the conductor tracks. The switching apparatus, preferably, has a plurality of switches that are in each case provided in a conductor track. Preferably, in each case a conductor track with a switch and a conductor track without a switch are disposed adjacent such that a capacitive coupling is possible. In such a case, the capacitive coupling must be such that a signal that is fed into a conductor track without a switch is received by the signal receiver approximately identically on the capacitively coupled conductor track. In this case, in one variant, the two conductor tracks may run directly adjacent to one another. In accordance with another variant, at least one further conductor track may be located between the two conductor tracks. The at least one further conductor track is advantageously floating, i.e., it is not utilized for the measurement method. This refinement makes it possible to achieve a greater capacitive coupling between the two conductor tracks. Conductor tracks that are used for the measurement method can also run, at least in sections, between the two conductor tracks.

In accordance with a further feature of the invention, the switches of the switching apparatus are connected to the drive and evaluation device and can be controlled by the latter. Equally, it is expedient that the signal receiver of the shield is connected to the drive and evaluation device. The switches of the switching apparatus and the signal receiver, thus, receives from the drive and evaluation apparatus a corresponding item of information as to which measurement method is to be carried out. The signal receiver, which may be part of the drive and evaluation device, is then able to decide whether an expected signal is received or an external manipulation is carried out.

In accordance with an added feature of the invention, the switching apparatus is part of the signal transmitter. In such a case, the signal transmitter would be connected to the drive and evaluation apparatus.

With the objects of the invention in view, there is also provided an apparatus for protecting an integrated circuit formed in a substrate, including a shield adapted to at least partially cover the integrated circuit, the shield having a signal transmitter, a signal receiver, at least two conductor tracks running between the signal transmitter and the signal receiver, a drive and evaluation device connected to the signal transmitter and to the signal receiver, a covering adapted to be applied on the substrate, and a switching apparatus having a first switching state enabling capacitive coupling between the at least two conductor tracks and a second switching state disabling capacitive coupling between the at least two conductor tracks and, thereby, enabling detection of damage to the shield.

With the objects of the invention in view, there is also provided an integrated circuit protecting apparatus for protecting an integrated circuit formed in a substrate, including a shield adapted to at least partially cover the integrated circuit, the shield having a signal transmitter, a signal receiver, at least two conductor tracks connecting the signal transmitter and the signal receiver, a drive and evaluation device connected to the signal transmitter and to the signal receiver, a covering adapted to be applied on the substrate, and a switching apparatus programmed to perform a capacitive measurement method in a first switching state and programmed to detect damage to the shield in a second switching state.

With the objects of the invention in view, in an integrated circuit formed in a substrate, there is also provided an apparatus for protecting the integrated circuit including a shield at least partially covering the integrated circuit, the shield having a signal transmitter, a signal receiver, at least two conductor tracks running between the signal transmitter and the signal receiver and connecting the signal transmitter to the signal receiver, a drive and evaluation device connected to the signal transmitter and to the signal receiver, a covering applied on the substrate, and a switching apparatus having a first switching state enabling capacitive coupling between the at least two conductor tracks and a second switching state disabling capacitive coupling between the at least two conductor tracks and, thereby, enabling detection of damage to the shield.

With the objects of the invention in view, there is also provided a method for protecting an integrated circuit formed in a substrate against "reverse engineering" including the steps of:

a) selection of the switching state of the switching apparatus by the drive and evaluation device;

b) application of a respective signal to the conductor tracks by the transmitting device;

c) evaluation of the signal received by the signal receiver by the drive and evaluation device;

d) initiation of a function change of the integrated circuit if the evaluation of the signal by the drive and evaluation device produces an unexpected result; and e) in the case of an expected signal, repetition of steps a) to d).

In accordance with an additional mode of the invention, preferably, the switching state of the switching apparatus is selected optionally or alternately by the drive and evaluation apparatus. The shield, thus, changes between the capacitive measurement method and the normal operating mode of an active shield in accordance with the control by the drive and evaluation apparatus.

In accordance with yet another mode of the invention, a particularly good protection is achieved when the switching state of the switching apparatus changes periodically or at random time intervals.

In accordance with yet a further mode of the invention, a further increase in the security is made possible by virtue of the fact that at least the signals present on a conductor track with a switch and on an adjacent conductor track without a switch are different if the switching apparatus is in the second switching state, that is to say, in the normal operating mode.

In accordance with yet an added mode of the invention, there are provided the steps of placing a switch on a first of the at least two conductor tracks, the one conductor track being adjacent to a second of the at least two conductor tracks without a switch, applying a first signal to the first conductor track with the transmitting device, and applying a second signal to the second conductor track with the transmitting device, the first and second signal being different when the switching apparatus is in the second switching state.

With the objects of the invention in view, there is also provided a method for protecting an integrated circuit formed in a substrate against reverse engineering, including the steps of at least partially covering the integrated circuit with a shield having a signal transmitter, a signal receiver, at least two conductor tracks running between the signal transmitter and the signal receiver, a drive and evaluation device connected to the signal transmitter and to the signal receiver, a covering applied on the substrate, and a switching apparatus having a first switching state enabling a capacitive measurement and a second switching state enabling detection of damage to the shield, selecting one of the first and second switching states with the drive and evaluation device, applying a respective signal to the at least two conductor tracks with the transmitting device, evaluating a signal received by the signal receiver with the drive and evaluation device, and if the evaluation of the signal by the drive and evaluation device produces an unexpected result, then initiating a function change of the integrated circuit, and if the evaluation of the signal by the drive and evaluation device produces an expected result, repeating the selecting, applying and evaluating steps.

Other features that are considered as characteristic for the invention are set forth in the appended claims.

Although the invention is illustrated and described herein as embodied in an apparatus for protecting an integrated circuit formed in a substrate and a method for protecting the integrated circuit against reverse engineering, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a block and schematic circuit diagram of the apparatus according to FIG. 1 in which the capacitive measurement method can be carried out; and FIG. 3 is a block and schematic circuit diagram of a further exemplary embodiment of the apparatus according to FIG. 1.

DESCRIPTION OF THE PREFERRED EMBODIMENTS

Figure 1:
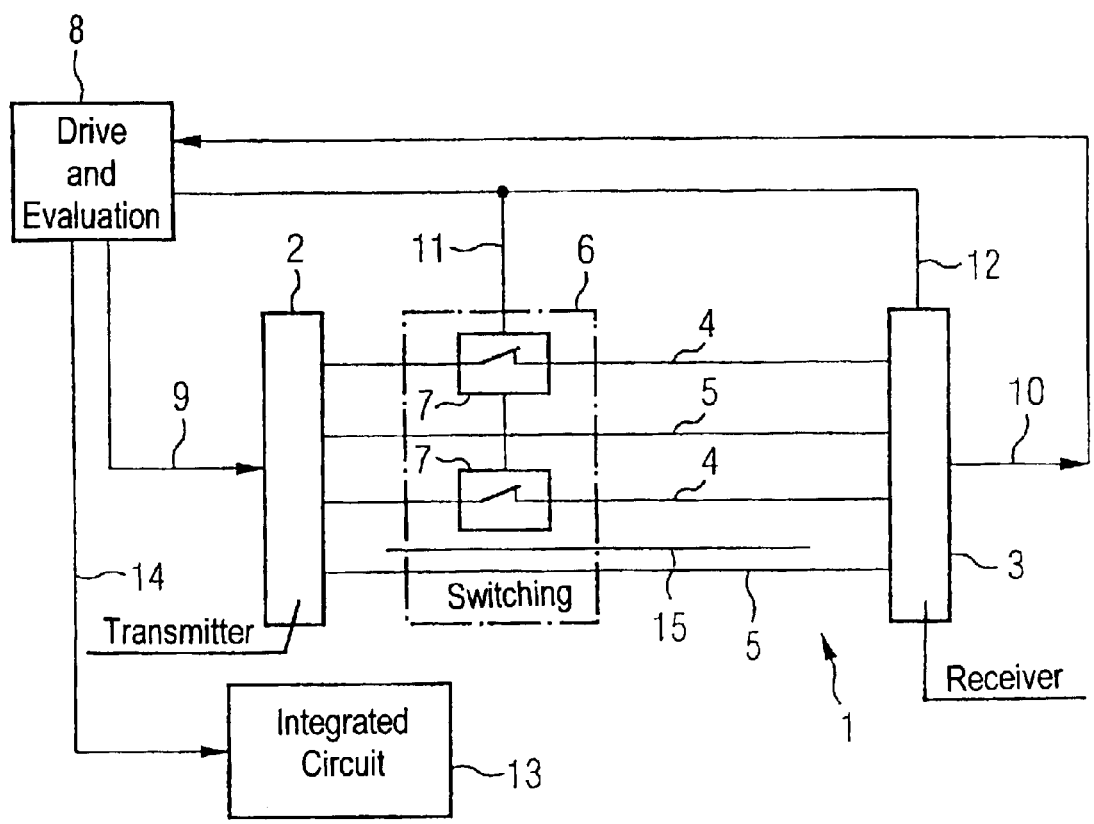
FIG. 1 is a block and schematic circuit diagram of an apparatus according to the invention for protecting an integrated circuit formed in a substrate in a normal operating mode.

Referring now to the figures of the drawings in detail and first, particularly to FIGS. 1 and 2 thereof, there are shown the basic construction of the invention's apparatus for protecting an integrated circuit formed in a substrate. The figures only show the functional assignment of the individual elements to one another. They do not, however, provide teaching with regard to how the elements shown are disposed spatially with respect to one another.

One possibility for protecting a circuit integrated in a substrate against an analysis lies in the integrated circuit being at least partially covered with a shield on the main side remote from the substrate. In such a case, at least those conductor tracks of the integrated circuit that carry critical signals are to be covered. In this case, as shown in FIG. 1, an active shield includes a signal transmitter 2, a signal receiver 3, a drive and evaluation device 8, and at least two conductor tracks 4, 5 running between the signal transmitter 2 and the signal receiver 3. Four conductor tracks 4, 5 running parallel to one another are illustrated in FIG. 1. The number of conductor tracks between the signal transmitter 2 and the signal receiver 3 may be as high as desired, in principle. The conductor tracks 4, 5 will advantageously be configured in meandering form or in grid form in two or more planes with respect to one another.

In the normal operating state of the active shield, as shown in FIG. 1, the signal transmitter 2 applies to each of the conductor tracks 4, 5 a signal that must be received identically by the signal receiver 3 in the case of intact conductor tracks 4, 5. The drive and evaluation device 8 causes the signal transmitter 2 to transmit signals with a predetermine magnitude and evaluates the signal received from the signal receiver 3. If the received signals do not correspond to the transmitted signals, then the drive and evaluation device 8, through a conductor track 14, causes the integrated circuit 13 to effect a function change. The latter may be, for example, an erasing of the data held in a memory or else in performing a reset.

A manipulation or analysis of the integrated circuit necessitates the removal or circumvention firstly of the non-illustrated covering composition surrounding the semiconductor chip and also of the shield situated above the integrated circuit. By the invention, it is, now, possible already to detect the removal of the covering. In such a case, the term "covering" is understood to be both a covering composition, e.g., a globe top, and one or more protective layers that are possibly present in addition on the passivation of the integrated circuit.

For such a purpose, the apparatus according to the invention has a switching apparatus 6, which is provided in a portion of the conductor tracks 4, 5. In the present exemplary embodiments, the conductor tracks identified by 4 have such switches. The conductor tracks identified by 5 are not provided with a switch. The switches may be provided as simple transistors, as logic, or as gates.

The switching apparatus, that is to say, the respective switches of a switching apparatus, are connected to the drive and evaluation device 8. The signal receiver 3 is, likewise, connected to the drive and evaluation device 8. The drive and evaluation device 8 controls the switching state. The signal receiver 3 is, likewise, informed of the state of the switching apparatus so that the received signals can be correctly evaluated.

In FIG. 1, the switches 7 of the switching apparatus 6 are closed so that the conductor tracks 4 correspond to the configuration of a customary active shield.

In FIG. 2, the drive and evaluation device 8 drives the switches 7 of the switching apparatus 6 such that the conductor tracks 4 between the signal transmitter and the signal receiver 3 are interrupted.

According to the invention, a conductor track 4 with a switch 7 and a conductor track 5 without a switch are disposed adjacent to one another such that, in the case of an open switch, a capacitive coupling can take place between the conductor tracks 4, 5. In the present example, the upper pair of lines runs directly adjacent to one another, while a floating further line track 15 is provided between the conductor tracks 4, 5 of the lower pair of lines. In this variant, a higher degree of capacitive coupling is possible during the capacitive measurement method. The signal fed into the conductor track 5 by the signal transmitter 2 must, therefore, be received at those ends of the conductor tracks 4 and 5 that are connected at the signal receiver 3.

To obtain a differentiation between the capacitive measurement method, which is performed in accordance with FIG. 2, and the normal measurement method in accordance with FIG. 1, it is advantageous to feed in different signals on the conductor tracks 4 and 5, respectively, in the normal measurement method. A different measurement signal must, then, correspondingly be received at the signal receiver 3 in the case of the normal measurement method. In the case of the capacitive measurement method, however, the signal receiver 3 must receive approximately identical signal values on the conductor tracks 4 and 5.

The drive and evaluation device 8 transmits a random or periodically changing signal sequence to the active shield, the latter, then, carrying out the capacitive and then the normal measurement method for a predetermined period of time in each case, i.e., changing back and forth between the capacitive and the normal measurement method. The removal of a chip covering, a plastic molding composition, a globe top, or a plastic protective layer (e.g., "imide") on the passivation, but also the removal of the passivation layer itself can be detected by the capacitive measurement method. The normal measurement method detects damage to the conductor tracks between the transmitting and receiving devices. If the transmitted and received data are different, then the functional sequence of the integrated circuit is influenced.

Signal transmitter 2 and signal receiver 3 may be part of the drive and evaluation device 8. They are advantageously disposed below the conductor tracks of the active shield to prevent a manipulation. They could even be part of the integrated circuit 13.

Attention is, again, drawn to the fact that the present FIGS. 1 and 2, in which the integrated circuit 13 is located beside the active shield 1, do not provide information about the spatial configuration with respect to one another. This configuration was chosen merely for the sake of clarity of illustration. The lines can change position a number of times in their course between the signal transmitter 2 and the signal receiver 3, as is illustrated diagrammatically in FIG. 3. The distances between the lines, then, represent statistical mean values.

The invention enables a very secure protection against an analysis through the combination of two detection methods. The apparatus can be realized by a minimal additional outlay on hardware, the provision of a switching apparatus in the conductor tracks of an active shield. Because the detection methods are not spatially separate, a local attack strategy is no longer possible. The invention, furthermore, has the advantage that the two measurement methods, the capacitive and the normal measurement method, reciprocally protect one another.

We claim:

1. An apparatus for protecting an integrated circuit formed in a substrate, comprising:

a shield at least partially covering the integrated circuit, said shield having:
    a signal transmitter;
    a signal receiver;
    at least two conductor tracks running between said signal transmitter and said signal receiver;
    a drive and evaluation device connected to said signal transmitter and to said signal receiver;
    a covering applied on the substrate; and
    a switching apparatus having:
    a first switching state enabling a capacitive measurement; and
    a second switching state enabling detection of damage to said shield.

2. The apparatus according to claim 1, wherein:

said at least two conductor tracks have a portion; and
    said switching apparatus is disposed in said portion of said at least two conductor tracks.

3. The apparatus according to claim 1, wherein said switching apparatus has a plurality of switches disposed in at least one of said at least two conductor tracks.

4. The apparatus according to claim 1, wherein said switching apparatus has a plurality of switches each respectively disposed in one of said at least two conductor tracks.

5. The apparatus according to claim 1, wherein two of said at least two conductor tracks are adjacent one another with a capacitive coupling.

6. The apparatus according to claim 1, wherein two of said at least two conductor tracks are disposed with respect to one another to form a capacitive coupling therebetween.

7. The apparatus according to claim 5, wherein:

a first of said two conductor tracks has a switch;
    a second of said two conductor tracks does not have a switch; and
    said first conductor track and said second conductor track are adjacent one another with a capacitive coupling.

8. The apparatus according to claim 6, wherein:

a first of said two conductor tracks has a switch;
    a second of said two conductor tracks does not have a switch; and
    said first conductor track and said second conductor track are disposed with respect to one another to form a capacitive coupling therebetween.

9. The apparatus according to claim 7, wherein said first and second conductor tracks are directly adjacent to one another.

10. The apparatus according to claim 8, wherein said first and second conductor tracks are directly adjacent to one another.

11. The apparatus according to claim 7, including at least one further conductor track disposed between said first and second conductor tracks.

12. The apparatus according to claim 8, including at least one further conductor track disposed between said first and second conductor tracks.

13. The apparatus according to claim 11, wherein said at least one further conductor track is a floating conductor track.

14. The apparatus according to claim 12, wherein said at least one further conductor track is a floating conductor track.

15. The apparatus according to claim 1, wherein:

said switching apparatus has a plurality of switches connected to said drive and evaluation device; and
    said drive and evaluation device controls said switches.

16. The apparatus according to claim 3, wherein:
said switches are connected to said drive and evaluation device; and
said drive and evaluation device controls said switches.

17. The apparatus according to claim 4, wherein:
said switches are connected to said drive and evaluation device; and
said drive and evaluation device controls said switches.

18. The apparatus according to claim 1, wherein said signal receiver is connected to said drive and evaluation device.

19. The apparatus according to claim 1, wherein said switching apparatus is part of said signal transmitter.

20. An apparatus for protecting an integrated circuit formed in a substrate, comprising:
a shield adapted to at least partially cover the integrated circuit, said shield having:
a signal transmitter;
a signal receiver;
at least two conductor tracks running between said signal transmitter and said signal receiver;
a drive and evaluation device connected to said signal transmitter and to said signal receiver;
a covering adapted to be applied on the substrate; and
a switching apparatus having:
a first switching state enabling capacitive coupling between said at least two conductor tracks; and
a second switching state disabling capacitive coupling between said at least two conductor tracks and, thereby, enabling detection of damage to said shield.

21. An integrated circuit protecting apparatus for protecting an integrated circuit formed in a substrate, comprising:
a shield adapted to at least partially cover the integrated circuit, said shield having:
a signal transmitter;
a signal receiver;
at least two conductor tracks connecting said signal transmitter and said signal receiver;
a drive and evaluation device connected to said signal transmitter and to said signal receiver;
a covering adapted to be applied on the substrate; and
a switching apparatus programmed to perform a capacitive measurement method in a first switching state and programmed to detect damage to said shield in a second switching state.

22. In an integrated circuit formed in a substrate, an apparatus for protecting the integrated circuit comprising:
a shield at least partially covering the integrated circuit, said shield having:
a signal transmitter;
a signal receiver;
at least two conductor tracks running between said signal transmitter and said signal receiver and connecting said signal transmitter to said signal receiver;
a drive and evaluation device connected to said signal transmitter and to said signal receiver;
a covering applied on the substrate; and
a switching apparatus having:
a first switching state enabling capacitive coupling between said at least two conductor tracks; and
a second switching state disabling capacitive coupling between said at least two conductor tracks and, thereby, enabling detection of damage to said shield.

23. A method for protecting an integrated circuit formed in a substrate against reverse engineering, which comprises:
providing an apparatus according to claim 1;
selecting one of the first and second switching states of the switching apparatus with the drive and evaluation device;
applying a respective signal to the at least two conductor tracks with the transmitting device;
evaluating a signal received by the signal receiver with the drive and evaluation device; and
if the evaluation of the signal by the drive and evaluation device produces an unexpected result, then initiating a function change of the integrated circuit, and if the evaluation of the signal by the drive and evaluation device produces an expected result, repeating the selecting, applying and evaluating steps.

24. The method according to claim 23, which further comprises selecting the one switching state one of optionally and alternately with the drive and evaluation apparatus.

25. The method according to claim 23, which further comprises optionally selecting the one switching state with the drive and evaluation apparatus.

26. The method according to claim 23, which further comprises alternately selecting the one switching state with the drive and evaluation apparatus.

27. The apparatus according to claim 23, which further comprises changing the one switching state one of periodically and at random time intervals.

28. The apparatus according to claim 23, which further comprises periodically changing the one switching state.

29. The apparatus according to claim 23, which further comprises changing the one switching state at random time intervals.

30. The method according to claim 23, which further comprises at least signals present on one of the at least two conductor tracks with a switch and an adjacent other one of the at least two conductor tracks without a switch being different if the switching apparatus is in the second switching state.

31. The method according to claim 23, which further comprises
placing a switch on a first of the at least two conductor tracks, the one conductor track being adjacent to a second of the at least two conductor tracks without a switch;
applying a first signal to the first conductor track with the transmitting device; and
applying a second signal to the second conductor track with the transmitting device, the first and second signal being different when the switching apparatus is in the second switching state.

32. A method for protecting an integrated circuit formed in a substrate against reverse engineering, which comprises:
at least partially covering the integrated circuit with a shield having:
a signal transmitter;
a signal receiver;
at least two conductor tracks running between the signal transmitter and the signal receiver;
a drive and evaluation device connected to the signal transmitter and to the signal receiver;
a covering applied on the substrate; and
a switching apparatus having:
a first switching state enabling a capacitive measurement; and
a second switching state enabling detection of damage to the shield;
selecting one of the first and second switching states with the drive and evaluation device;

applying a respective signal to the at least two conductor tracks with the transmitting device;

evaluating a signal received by the signal receiver with the drive and evaluation device; and if the evaluation of the signal by the drive and evaluation device produces an unexpected result, then initiating a function change of the integrated circuit, and if the evaluation of the signal by the drive and evaluation device produces an expected result, repeating the selecting, applying and evaluating steps.

* * * * *